(12) United States Patent
Miida

(10) Patent No.: US 7,052,019 B2
(45) Date of Patent: May 30, 2006

(54) PISTON RING AND METHOD OF MANUFACTURING THE SAME

(75) Inventor: Hiroshi Miida, Kashiwazaki (JP)

(73) Assignee: Kabushiki Kaisha Riken, Tokyo (JP)

( * ) Notice: Subject to any disclaimer, the term of this patent is extended or adjusted under 35 U.S.C. 154(b) by 0 days.

(21) Appl. No.: 10/451,732

(22) PCT Filed: Dec. 21, 2001

(86) PCT No.: PCT/JP01/11278

§ 371 (c)(1),
(2), (4) Date: Jun. 25, 2003

(87) PCT Pub. No.: WO02/052179

PCT Pub. Date: Jul. 4, 2002

(65) Prior Publication Data

US 2004/0056425 A1    Mar. 25, 2004

(30) Foreign Application Priority Data

Dec. 26, 2000 (JP) ............................. 2000-395674

(51) Int. Cl.
*F16J 9/26* (2006.01)
(52) U.S. Cl. ..................................... 277/443; 427/526
(58) Field of Classification Search ........ 277/442–444; 427/526, 425
See application file for complete search history.

(56) References Cited

U.S. PATENT DOCUMENTS

| | | | | |
|---|---|---|---|---|
| 1,783,047 A | * | 11/1930 | Marshall | ...................... 148/589 |
| 2,905,512 A | * | 9/1959 | Anderson | .................... 277/442 |
| 4,299,401 A | * | 11/1981 | McCormick | ................. 277/440 |
| 5,601,293 A | * | 2/1997 | Fukutome et al. | .......... 277/443 |
| 5,677,011 A | * | 10/1997 | Hatakeyama et al. | ....... 427/497 |
| 6,548,110 B1 | * | 4/2003 | Shirley | ........................ 427/240 |
| 6,576,523 B1 | * | 6/2003 | Honda et al. | ............... 438/381 |

FOREIGN PATENT DOCUMENTS

| | | |
|---|---|---|
| DE | 1 000 651 | 1/1957 |
| DE | 1 222 748 | 8/1966 |
| JP | 56-171651 U | 5/1980 |
| JP | 7-24545 A | 1/1995 |
| JP | 7-27228 A | 1/1995 |
| JP | 7-292458 A | 11/1995 |
| JP | 10-140351 A | 5/1998 |
| JP | 10-252890 A | 9/1998 |
| JP | 11-152558 A | 6/1999 |
| JP | 2000-120866 A | 4/2000 |
| JP | 2000-274531 A | 10/2000 |
| RU | 2021553 C * | 10/1994 |
| RU | 2110693 C * | 5/1998 |

* cited by examiner

*Primary Examiner*—Alison K. Pickard
(74) *Attorney, Agent, or Firm*—Kubovcik & Kubovcik

(57) ABSTRACT

A manufacturing method of a piston ring is developed, wherein the method provides a countermeasure for wear of butt ends of the ion plating film coated piston ring and a countermeasure for breakage of the piston ring and the piston ring manufactured at a low cost. A thickness of the film (2) in the vicinity of butt ends (7) of a piston ring (1) is made greater than the thickness of the film (2) at other outer peripheral surface. Piston ring blanks (5) are rotated around their own axes toward an evaporation source (4) and a speed is lowered when the butt ends (7) face the evaporation source (4).

3 Claims, 5 Drawing Sheets

PISTON RING AND METHOD OF MANUFACTURING THE SAME

TECHNICAL FIELD

The present invention relates to a piston ring for an internal combustion engine, and more particularly to a piston ring for an internal combustion engine which exhibits an improvement on a film and a thickness of an outer peripheral surface thereof and a method for manufacturing the same.

BACKGROUND ART

Recently, because of a demand for a higher power of an engine and measures for an exhaust gas to minimize atmospheric pollution, use environment of the piston ring is becoming severer and wear of an outer peripheral surface of the piston ring has been a problem to be solved. To cope with such the problem, there has been provided a piston ring which has an outer peripheral surface thereof coated with a hard film which exhibits excellent anti-scuffing and wear resistance such as a film made of chromium nitride, titanium nitride or the like by ion plating in place of a conventional hard chromium plating film or nitriding treatment.

However, in a diesel engine using a piston ring with such a nitride on an outer peripheral surface thereof as a hard film, when the combustion pressure is high or when an exhaust gas countermeasure is taken by a large quantity of EGR (Exhaust Gas Recirculation), there arises the problem that the wear on the outer peripheral slide surface is increased. Accordingly, it is less than optimal to ensure the lifetime and the sealing performance of the piston ring for a long time. Particularly, with respect to an outer peripheral slide surface of a portion of butt ends of a top ring which define a gap, since a high temperature combustion gas passes a closed gap between the butt ends when compressed within a cylinder and hence, the lubrication condition is more serious compared to other portions. Further, since force pressing the outer peripheral slide surface of piston ring to an inner wall surface of the cylinder by combustion gas pressure is greater at butt ends than that at other portion of a piston ring, the wear of the outer peripheral surface at the butt ends is greater than that of the other surface.

Due to such wear, when the hard film formed on the outer peripheral slide surface of the butt ends or the portion thereof by ion plating is dissipated, a steel material which constitutes a substrate is exposed to a slide surface so that the wear rapidly progresses whereby the closed gap size between the butt ends is increased resulting in lowering of the sealing function.

Lowering of the sealing function attributed to the increase of closed gap size increases a quantity of blowby gas which is a combustion gas blowing to an oil pan side so that oil is degraded. Further, a lubricating oil leaks to a combustion chamber side and this brings about not only the increase of an oil consumption but also the occurrence of environmental problem such as the increase of sulfuric component in an exhaust gas or the like. Further, when the hard film is dissipated due to wear and the substrate material of steel is exposed, the danger of engine scuffing is also increased.

In view of the above, finding of a countermeasure to cope with the wear in the vicinity of the butt ends has been an important task to be solved. As the countermeasure to cope with the wear of the butt ends, in Japanese Unexamined Patent Publication No. 2000-120866, there has been proposed an idea in which a radial wall thickness in the vicinity of the butt ends is set smaller than that of other portion of a piston ring by approximately 20 to 30% and hence, a face pressure attributed to an own expanding force is decreased at the butt ends whereby the sealing ability is maintained and, at the same time, the wear of the butt ends is prevented.

However, with respect to a top ring, at a top dead point of a piston, explosive combustion pressure is applied to a back surface of the piston ring and hence, the butt ends are pressed to an inner peripheral wall of the cylinder with a pressure which far exceeds a pressure derived from the own expanding force. Accordingly, it is the fact that the proposal disclosed in the previously mentioned publication is also less than optimal as the countermeasure.

Further, in a high-load diesel engine which increases the combustion pressure or in an engine which adopts an exhaust brake, the piston ring is deformed in a dish shape at the time of explosive combustion or at the time of operating an exhaust brake and this is liable to induce wear of ring grooves of the piston. When the ring groove of the piston is worn, the dish-like deformation of the piston ring is enlarged. Due to this repeated deformation stress, the fatigue breakage of the piston ring is liable to be induced at a position opposite to the butt ends at which the stress is concentrated.

The hard film is poor in toughness and cracks are liable to easily initiate due to the stress concentration. Particularly, when a thickness of the hard film is increased, this tendency becomes more remarkable. Further, when the hard film is made of nitride formed by ion plating (for example, chromium nitride, titanium nitride or nitrides in which oxygen, carbon, boron or the like is added to those nitrides), there has been a problem that the film is peeled off due to fatigue of repeated friction force which is attributed to the sliding movement between the piston ring and an inner peripheral wall of the cylinder.

To prevent this film peeling caused by the frictional force, it is effective to intentionally introduce a compressive residual stress into the film by changing a bias voltage or the like in the ion plating process. In the ion plating, in general, the film has a tendency to grow and to be stacked while generating a compressive stress in a film forming process in reference to the substrate. However, when the compressive residual stress is made to remain in the hard film, the tensile residual stress is generated in a portion of the substrate material right below the film. When the piston ring is deformed in a dish shape, provided that an external stress and the residual stress are combined, a maximum tensile stress is generated right below the film in many cases. When a defect or the like exists in the vicinity of the portion, it functions as a starting point of fatigue failure and hence, there arises a new problem that the breakage of the piston ring is liable to occur easily. This tendency becomes more apparent corresponding to the increase of the thickness of the hard film.

Further, when the hard film is uniformly thick as mentioned previously, there arises a problem on a cost besides the above-mentioned problems. Particularly, when the hard film is formed by ion plating, ion plating equipment is expensive, the film forming speed is slow compared to that of other method such as electric plating or thermal spraying and hence, the productivity is low. Further, a target such as chromium or titanium is also expensive, the greater the film thickness, the piston ring becomes more costly.

Further, the shape of the piston ring is changed when microstructure of material is changed. The deformation is liable to occur in the direction that the curvature of the free shape of the butt ends of the piston ring is increased, that is, in the direction that the diameter of the piston ring is decreased.

Accordingly, film forming is performed at a temperature of approximately 500° C. which is equal to or below a tempering temperature of the substrate material. However, as mentioned previously, when the compressive stress remains in the film, the film is deformed even at a temperature which the microstructure change of the material does not occur and this deformation is remarkably large when the heat-resistant element in the substrate material is small in quantity. Accordingly, when a compressive residual stress is generated in the film, this tendency becomes particularly apparent along with the increase of the film thickness. Particularly, since the curvature of the outer peripheral portion in the vicinity of the butt ends is substantially equal to the nominal diameter of the piston ring, when the curvature of this portion increases (the curvature being continuously changed to decrease the diameter), a non-contact region is formed between the outer peripheral surface of the piston ring and the inner peripheral wall of the cylinder.

In the manufacturing process of the piston ring, there exists a lapping step in which, to finish the piston ring into predetermined nominal outer diameter size and shape, and further to smooth the surface roughness of the outer periphery of the piston ring, the piston ring is set inside a lapping sleeve having a predetermined inner diameter after performing film forming by ion plating and the outer periphery surface made of the film is polished. In the piston ring coated with the ion plating film, due to the above-mentioned reason, the non-contact region is liable to be easily formed on the outer peripheral portion in the vicinity of the butt ends in the lapping step. To obtain the complete contact between the outer peripheral portion of the piston ring and the inner peripheral wall of the lapping sleeve, it takes a considerable time for lapping and, in a worst case, even when the other film is dissipated, the contact in the vicinity of the butt ends cannot be obtained.

Further, since an inner peripheral surface of the sleeve for lapping is worn out in that case, the lifetime of the sleeve for lapping is extremely shortened resulting in the manufacturing of costly piston ring.

DISCLOSURE OF THE INVENTION

The present invention has been made in view of the above-mentioned problems and it is a task of the present invention to provide a piston ring and a method for manufacturing the same which can achieve both of the measure to cope with wear of butt ends of the piston ring on which a hard film, especially, an ion plating film is formed on the outer peripheral surface and the measure to cope with breakage of the piston ring and can manufacture the piston ring at a low cost.

The present invention provides a piston ring having an outer peripheral surface coated with a hard film, wherein the hard film holds a compression residual stress and a film thickness of the hard film in the vicinity of butt ends is set greater than that of other outer peripheral surface.

It is preferable that the film thickness in the vicinity of the butt ends is set 1.5 to 4 times as thick as that at a portion opposite to the butt ends.

Further, it is preferable that the hard film is mainly composed of nitride.

According to the present invention, there is further provided an ion plating film forming method for piston rings in which the stacked piston ring blanks are rotated around their own axes and revolved around an evaporation source of ion plating film, and a rotational speed of the stacked piston ring blanks at a point of time that the butt ends straightly face the evaporation source or during a period ranging from before to after the butt ends straightly face the evaporation source is slower than a rotational speed when the other portion straightly face the evaporation source.

According to the present invention, in a method for manufacturing the above-mentioned piston rings according to the first or second invention, there is further provided a method for manufacturing piston rings, wherein the stacked piston ring blanks are mounted on a number of jigs and, at the same time, at the time of rotating around their own axes and revolving around an evaporation source which is positioned at a revolving center so as to coat an ion plating film to outer peripheral surfaces of the stacked piston ring blanks, the stacked piston ring blanks are set on the respective positions in a ion plating equipment such that rotation of the butt ends of each stacked piston ring blanks is in phase and, thereafter, the rotation/revolution speeds of the stacked piston ring blanks when the butt ends straightly face the evaporation source are set slower than those of them when the other portions straightly face the evaporation source.

Advantageous effects of the piston ring of the present invention are as follows:

(1) The hard ion plating film having high wear resistance which is coated to the outer periphery surface has the compressive residual stress and hence, irrespective of the presence of a frictional force which is repeatedly loaded due to a sliding movement with an inner peripheral wall of a cylinder, it is possible to prevent peeling off the film attributed to fatigue.

(2) On the outer peripheral surface in the vicinity of the butt ends which is liable to be worn due to the severe sliding condition, the hard film having a large thickness is formed and hence, it is possible to eliminate problems such as lowering of sealing performance or scuffing which are conventionally occurred due to the rapid wear progress by the dissipation of the hard film and the exposure of the substrate material portion.

(3) The hard film has the smaller film thickness at portions other than the butt ends and hence, even when the compressive residual stress is held in the film, chipping of the hard film or the like hardly occurs whereby the yield rate of the manufacturing process can be enhanced. Further, since the film is thin, a tensile residual stress which generates in the substrate portion right below the film is also decreased and hence, the fatigue rupture of the piston ring is hardly occurred.

(4) Compared to a case in which a thick film is uniformly formed on the outer peripheral surface, only a thickness of the portion which is liable to be worn is increased and hence, the film forming time can be shortened whereby the coating productivity using the expensive ion plating equipment can be improved and the target consumption can be also reduced. Accordingly, it is possible to provide the piston ring at a low cost.

(5) Corresponding to an amount of increase of the curvature of the outer peripheral portion of the butt ends which are generated by film forming, it is possible to increase the film thickness in the vicinity of the butt ends compared to that of other portions and hence, in a lapping step, it is possible to easily ensure a contact with the outer peripheral portion of the butt ends of the piston ring whereby the lapping productivity can be enhanced. Alternatively, since the wear of a lapping sleeve can be reduced, it is possible to produce the piston ring at a low cost.

Next, the advantageous effects of the method for manufacturing the piston ring are explained.

(1) By making the rotational speed of the stacked piston ring blanks at a point of time that the butt ends straightly face the evaporation source or during a period ranging from before to after the point of time that the butt ends straightly face the evaporation source slower than that the rotational speed of the stacked piston ring blanks at a point of time that other portions straightly face the evaporation source, it is possible not only to set the film thickness in the vicinity of the butt ends to an arbitrary thickness compared to the film thickness of other portions but also to provide the film thickness which can be changed at an arbitrary change rate and also continuously.

(2) When the stacked piston ring blanks are mounted on a number of jigs and they are rotated around their own axes and revolved around the evaporation source which is positioned at the revolving center so as to coat ion plating films to outer peripheral surfaces of them, they are set on respective positions in the ion plating equipment such that the rotation of the butt ends of the stacked piston ring blanks is in phase, and the rotation/revolution speeds of the stacked piston ring blanks when the butt ends straightly face the evaporation source are set slower than the rotation/revolution speeds of the stacked piston ring blanks when the other portions straightly face the evaporation source. Accordingly, it is possible to easily coat the hard film having the arbitrary film thickness distribution to the outer peripheral surfaces of the piston ring blanks. Further, the properties dispersion within one batch processing can be reduced and hence, the piston rings can be manufactured with high stability in quality. Accordingly, it is possible to provide the piston rings at a low cost.

BEST MODE FOR CARRYING OUT THE INVENTION

Hereinafter, embodiments of the present invention are explained in detail.

Figure 1A:
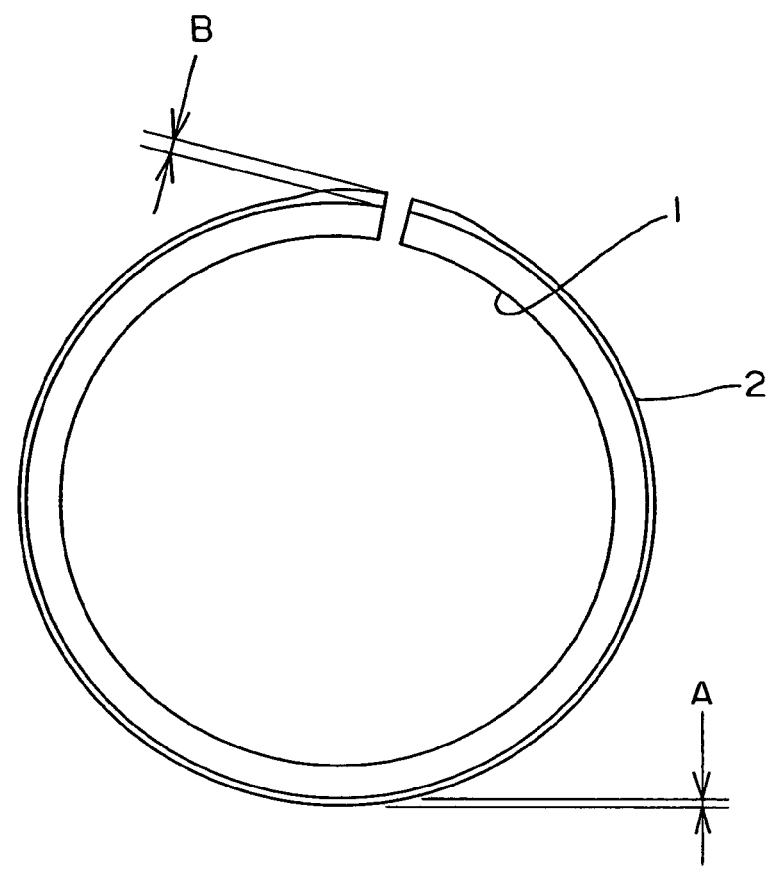
FIG. 1(a) is a plan view of a piston ring as viewed in the axial direction. In the drawing, A is an outer peripheral film thickness of a portion opposite to butt ends and B is an outer peripheral film thickness in the vicinity of the butt ends.
Figure 1B:
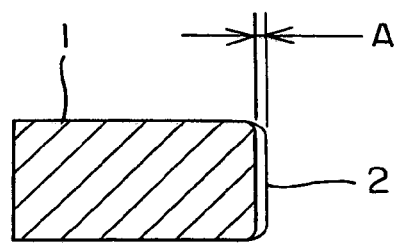
FIG. 1(b) is a cross-sectional view of the piston ring in the radial direction of a portion opposite to the butt ends.
Figure 1C:
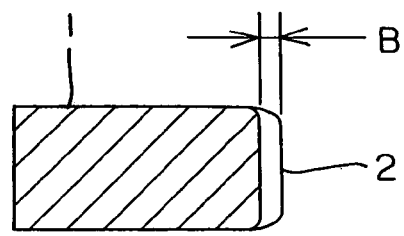
FIG. 1(c) is a cross-sectional view of the piston ring in the radial direction in the vicinity of the butt ends.

FIG. 1 shows a piston ring 1 which constitutes one example of the present invention. In the drawing, (a) is a plan view of the piston ring as viewed in the axial direction and (b) is a cross-sectional view of the piston ring 1 in the radial direction of a portion opposite to butt ends, wherein A indicates a thickness of an ion plating film 2. (c) is a cross-sectional view of the piston ring 1 in the radial direction in the vicinity of the butt ends, wherein B indicates a thickness of the ion plating film 2.

A typical manufacturing process of the above-mentioned piston ring is explained.

First of all, a steel wire or strip material capable of having arbitrary various cross-sectional shapes is formed into a coil of an approximately piston ring shape. Here, an outer peripheral surface shape may be also a BF (Barrel Faced), an eccentric BF or a half BF.

In coiling step, the steel wire material is coiled into a curvature which is preliminarily obtained by correcting a change of curvature generated by strain relieving heat treatment after coiling. This setting of curvature may change also depending on a shape of a cross-sectional area, a nominal diameter of a final ring and the alloy composition of the steel wire. Particularly, the influence of the alloy composition is large. When the alloy composition is of high C % and contains a component such as Cr, Mo, V, Nb or the like which shows the high resistance against softening in tempering treatment, the change of curvature due to the strain relieving heat treatment after coiling is small. The steel wire such as spring steel which contains a small amount of such an alloy component is characterized by exhibiting a large change of curvature due to the strain relieving heat treatment after coiling.

Further, in coiling, the steel wire material is coiled one by one using an NC control. However, the steel wire material may be formed one by one using a master cam having a given curvature in mass production in a profiling system.

The piston ring material which is formed into a given outer peripheral curvature in the above-mentioned manner is subjected to the strain relieving heat treatment which conforms to the alloy composition so as to relieve a residual stress. Although the heat treatment conditions depend on the alloy composition of the steel wire, the steel wire is usually held at a temperature of 450 to 650° C. for 30 minutes to 1 hour.

Thereafter, when necessary, gas nitriding, both side-surface grinding, outer peripheral surface grinding, and outer peripheral surface lapping are performed. Next, cleaning such as pickling (acid cleaning), alkaline degreasing or the like is performed, and the stacked piston ring blanks are set on respective positions in an ion plating equipment.

An ion plating equipment and an ion plating method for forming a hard film are explained hereinafter.

Figure 2:
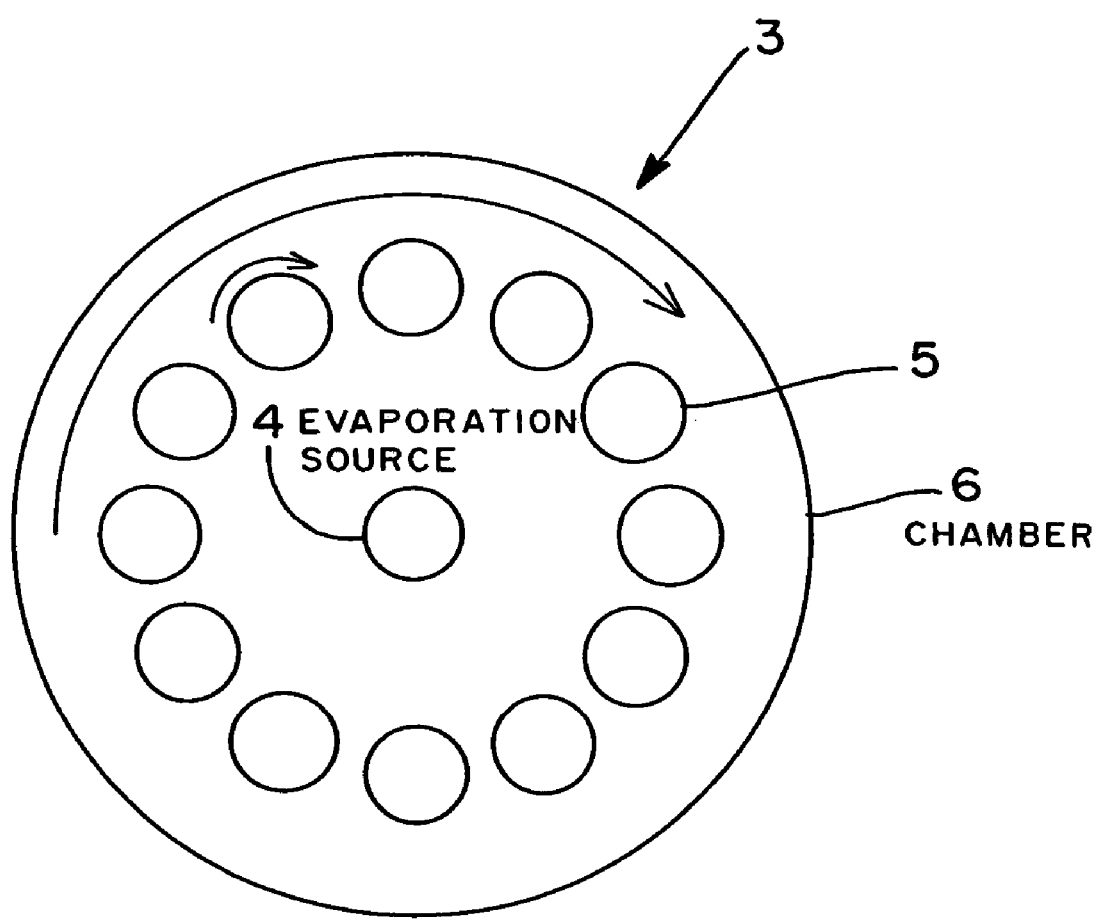
FIG. 2 is a plan view showing one embodiment of an ion plating equipment for manufacturing the piston rings of the present invention.

FIG. 2 is a plan view showing the inside of the ion plating equipment 3 and shows the relationship between the position of an evaporation source 4 and the positions of stacked piston ring blanks 5. The stacked piston ring blanks 5 mounted on each jig such that butt ends of them are arranged in a fixed direction are arranged at 12 positions in a radial direction around the evaporation source 4 at an equal angle. The stacked piston ring blanks 5 revolve around the evaporation source 4 by using a planetary gear structure not shown in the drawing and, at the same time, rotate around their own axes toward the evaporation source.

The rotation of stacked ring blanks is set such that each stacked piston ring blanks 5 performs the 215/17 rotation during a period in which it performs 1 revolution around the evaporation source 4. The gear ratio between the revolution and the rotation is not specifically limited to the above-mentioned value and there is no problem in choosing an arbitrary ratio. Since the rotation/revolution structure of the planetary gear system is adopted, the equipment is configured such that the rotational shafts are rotated by way of gears at the above-mentioned gear ratio by rotating the revolution shaft.

The piston ring blanks 5 already cleaned are axially stacked on the jigs such that the butt ends are arranged in a fixed direction. These jigs are set to 12 positions respectively. Here, to make rotation of all stacked piston ring blanks set on 12 positions be in phase, they are set such that the butt ends are directed toward the center of evaporation source.

The inside of a vessel 6 is evacuated by a vacuum pump. When the pressure inside the vessel 6 is lowered to a value equal to or less than a given pressure, the piston ring blanks 5 are heated by a heater not shown in FIG. 2 to achieve a given temperature while being rotated around their own axes and revolved. Here, to ensure uniform heating, the rotation/revolution speeds of respective shafts are fixed.

Next, film forming is started by running an arc to a known evaporation source (target). Here, the film is formed by setting the rotation/revolution speeds to fixed values such that the uniform film thickness of approximately several μm is obtained. Thereafter, the rotational speed of a motor not shown in FIG. 2 is controlled such that the rotational speed in the period that the butt ends of the piston ring is directed to the center of evaporation source is set to ½ to ¼ of the rotational speed in other period.

Since the equipment of this embodiment adopts the combination of gears which provide one rotation for $17/215$ revolution, the periodical speed control is performed such that the $17/215$ rotation of the revolution shaft is set as 1 cycle and during this cycle, the rotational speed in the period that the butt ends of the stacked piston ring blanks are directed toward the evaporation source becomes the minimum rotational speed, and the speed is changed with the continuous sinusoidal waveform and the speed ratio becomes 2 to 4 times.

The butt ends of the stacked piston ring blanks 5 assume the minimum rotational speed in the period that the butt ends straightly face the center of evaporation source. Thereafter, as the butt ends are rotated to the direction opposite to the evaporattion source by 180°, the speed is continuously increased and assumes the maximum speed at the direction opposite to the evaporation source by 180°. Again, the rotational speed is continuously decelerated such that it assumes the minimum speed at the position where the butt ends straightly face the evaporation source. Accordingly, theoretically, the film thickness is continuously changed such that the film thickness at the butt ends assumes the maximum value and the film thickness at the portion opposite to the butt ends by 180° assumes the minimum value. Further, the film is formed in the same manner by adopting a method in which, the rotational speed of the stacked piston ring blanks is made slow in a fixed zone between points of time before and after the butt ends straightly face the evaporation source.

The piston rings are cooled after film forming such that the inner temperature of the equipment assumes 100° C. and, thereafter, the pressure inside a vessel is returned to the atmospheric pressure and, thereafter, the jigs are removed. The piston rings are removed from respective jigs and the outer peripheral surfaces are lapped to a given surface roughness using free abrasive grains in a lapping machine. Further, side surfaces are ground when necessary. Alternatively, in case of the piston ring blanks 5 which are not subjected to nitriding treatment, salt-bath nitriding or gas nitriding is performed and finish-grinding of side surfaces is performed when necessary. Finally, grinding which adjusts gap sizes between the butt ends is performed so as to obtain given piston rings 1.

It is preferable that the piston ring size (diameter) is in a range of 50 to 250 mmΦ, the thickness of the film is in a range of 0.01 to 0.1 mm, and carbon steel, silicon chromium steel, or martensitic stainless steel is used as the piston ring material. It is preferable that the film thickness of an outer peripheral surface of the butt ends is 40 to 55 μm.

Hereinafter, the explanation is made based on embodiments.

Using a steel wire having the alloy composition and heat treatment history shown in table 1, having a rectangular cross section of radial wall thickness of 3.35 mm and ring width of 2.4 mm and also having an approximately BF shape as a shape of a surface corresponding to the outer peripheral surface, the coiled material is formed using an NC coiling machine with a curvature which is obtained by correcting the change of curvature attributed to the strain relieving heat treatment after coiling and, thereafter, the piston ring blanks are produced by cutting the coiled materials one by one. Thereafter, the strain relieving treatment, the both side-surface grinding, the gas nitriding treatment and an outer peripheral surface lapping are performed. Next, these piston ring blanks are subjected to cleaning such as pickling, alkaline degreasing or the like so as to clean the outer peripheral surface.

TABLE 1

| steel wire | Alloy composition, weight (%) | | | | | | | | | | | Heat treatment conditions | |
|---|---|---|---|---|---|---|---|---|---|---|---|---|---|
| | C | Si | Mn | P | S | Cr | Mo | V | Nb | N | Fe | Hardening | tempering |
| A | 0.85 | 0.30 | 0.35 | 0.02 | 0.02 | 17.50 | 1.05 | 0.11 | — | | Balance | 930° | 630° |
| B | 0.65 | 0.30 | 0.35 | 0.02 | 0.02 | 13.50 | 0.28 | 0.20 | — | | Balance | 930° | 630° |
| C | 0.65 | 0.25 | 0.30 | 0.02 | 0.02 | 10.50 | 0.35 | 0.20 | 0.10 | — | Balance | 1000° | 625° |
| D | 0.60 | 0.25 | 0.20 | 0.02 | 0.02 | 8.05 | 0.33 | 0.15 | — | — | Balance | 980° | 625° |
| E | 0.40 | 0.95 | 0.32 | 0.02 | 0.02 | 5.12 | 1.45 | 0.90 | — | — | Balance | 980° | 625° |
| F | 0.65 | 1.43 | 0.67 | 0.02 | 0.02 | 1.58 | 0.30 | 0.58 | — | — | Balance | 1000° | 575° |
| G | 0.45 | 2.50 | 0.40 | 0.02 | 0.02 | 1.05 | 0.20 | 0.20 | 0.15 | 0.30 | Balance | 980° | 550° |
| H | 0.46 | 1.50 | 0.70 | 0.02 | 0.02 | 0.70 | — | — | — | — | Balance | 980° | 450° |

In the above-mentioned ion plating equipment 3 shown in FIG. 2, the jigs each of which axially stack the piston ring blanks 5 which are already subjected to cleaning thereon such that the butt ends are arranged in a fixed direction are set on 12 respective positions. Here, to make the rotation of all stacked piston ring blanks 5 at 12 positions be in phase, the piston ring blanks 5 are arranged such that the butt ends are directed to the center of evaporation source 4.

Figure 3:
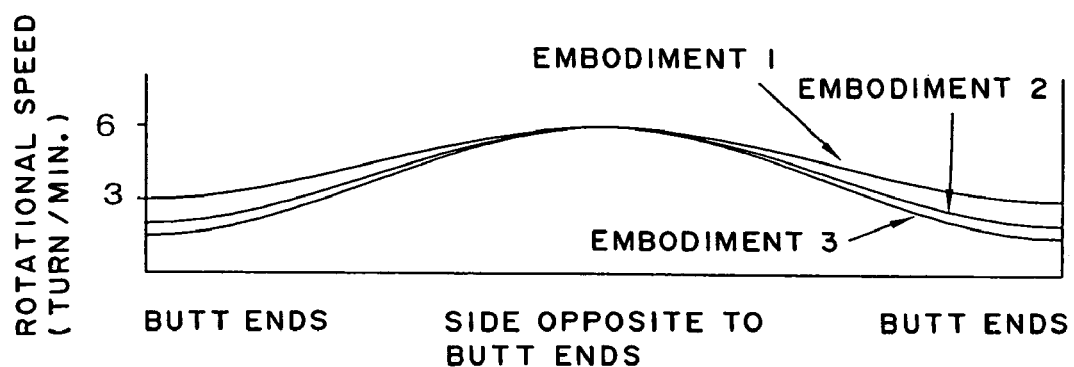
FIG. 3 is a graph showing rotational speed patterns of embodiments 1, 2, 3.
Figure 4:
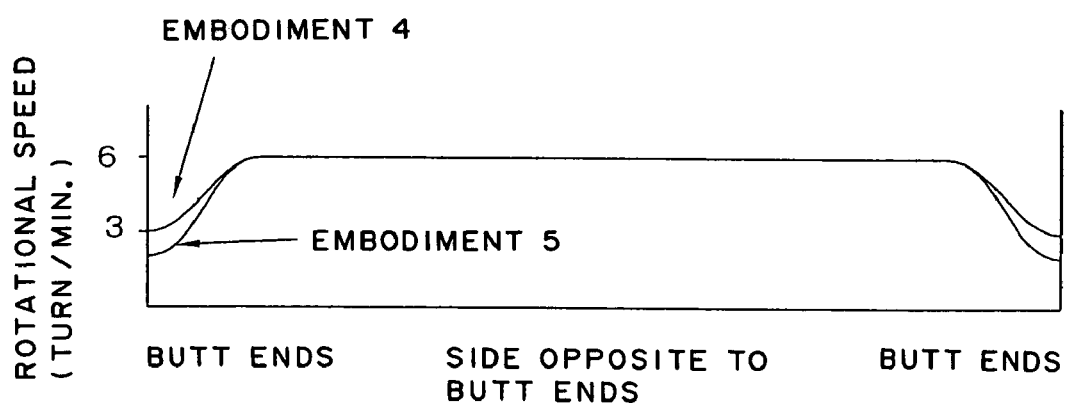
FIG. 4 is a graph showing rotational speed patterns of embodiments 4, 5.

The inside of the vacuum vessel is evacuated to $2.5 \times 10^{-4}$ torr using a vacuum pump and the stacked piston ring blanks 5 are heated up to a temperature of 450° C. When the stacked piston ring blanks 5 reach a given temperature and become stable, a nitrogen gas is introduced into the vacuum vessel until the degree of vacuum reaches $1 \times 10^{-2}$ torr. After a lapse of 30 minutes, an operation mode is changed to change the rotation/revolution speeds of the stacked piston ring blanks 5. Then, at the rotational speed shown in Table 2 and using speed patterns shown in FIG. 3 and FIG. 4, an ion plating film is formed on outer peripheral surfaces of the piston ring blanks after 7 hours and 30 minutes.

Metal chromium is used as the evaporation source 4 and coating is performed at conditions where an arc current is set to 1000 A and a bias voltage is set to 10V. The obtained film is CrN having hardness (HMV) of 1800.

TABLE 2

| | Rotational speed of stacked piston ring blanks |
|---|---|
| Embodiment 1 | Rotational speed is sinusoidal wave (maximum speed:minimum speed = 2:1), maximum speed = 6 turn/min |
| Embodiment 2 | Rotational speed is sinusoidal wave (maximum speed:minimum speed = 3:1), maximum speed = 6 turn/min |
| Embodiment 3 | Rotational speed is sinusoidal wave (maximum speed:minimum speed = 4:1), maximum speed = 6 turn/min |
| Embodiment 4 | Rotational speed in azone covering 45° before and after the butt ends straight face the evaporation source is 1/2 of speed at other portion, maximum speed = 6 turn/min |
| Embodiment 5 | Rotational speed in a zone covering 45° before and after the butt ends straight face the evaporation source is 1/3 of speed at other portion, maximum speed = 6 turn/min |

After forming the film, cooling is effected until the temperature inside the equipment becomes 100° C. and the pressure inside the vessel is returned to atmospheric pressure. Thereafter, the jigs are removed and, then, the piston rings are removed from the jigs. Lapping is performed using a lapping machine so as to lap outer peripheral surfaces of piston rings with free abrasive grains under conditions shown in Table 3.

TABLE 3

| Abrasive Material | SiC |
|---|---|
| Abrasive Grain Size | #4000 |
| Concentration of Abrasive Grains | 25 g/litter |
| Speed | 1 stroke/second |

The film thickness of the outer peripheral surface at the butt ends and at the portion opposite to the butt ends coated under respective experimental conditions and the numbers of lapping until a contact with the outer peripheral surface is obtained with respect to each steel wire are shown in Table 4. Further, as a comparison example, a piston ring which is manufactured using a conventional ion plating film coating method is shown. In this method, the rotation speed is fixed to 6 turn/min.

According to the result of experiment using an X-ray diffraction, the residual stress of the CrN film is 600 to 700 MPa with respect to all specimens. After completion of lapping, finish grinding is performed to both side surfaces of the piston rings and, finally, grinding is performed so as to adjust a gap size between the butt ends, whereby given piston rings having a nominal diameter (d1) of 95 mm, a radial wall thickness (a1) of 3.35 mm and a ring width (h1) of 2.33 mm are obtained.

TABLE 4

| | Film thickness of butt ends | Film thickness of portion opposite to butt ends | Number of lapping (times) | | | | | | | |
|---|---|---|---|---|---|---|---|---|---|---|
| | | | Steel wire A | Steel wire B | Steel wire C | Steel wire D | Steel wire E | Steel wire F | Steel wire G | Steel wire H |
| Comparison example | 30 μm | 32 μm | 1000 | 1100 | 1300 | 1400 | 1500 | 2000 | 2000 | NG |
| Embodiment | | | | | | | | | | |
| 1 | 41 μm | 22 μm | 300 | 300 | 350 | 350 | 350 | 500 | 700 | 800 |
| 2 | 50 μm | 18 μm | 250 | 250 | 300 | 300 | 300 | 400 | 500 | 600 |
| 3 | 55 μm | 15 μm | 300 | 250 | 250 | 250 | 250 | 300 | 330 | 500 |
| 4 | 44 μm | 22 μm | 300 | 275 | 350 | 350 | 350 | 450 | 500 | 600 |
| 5 | 52 μm | 18 μm | 250 | 250 | 300 | 300 | 300 | 400 | 400 | 500 |

NG: A film at other portion disappears before the contact is obtained over the whole periphery.

Although there exist cases in which, first of all, the contact is obtained at the butt ends and, thereafter, the contact is obtained at other portions, the number of lapping until the contact is obtained over the whole periphery is counted.

As shown in Table 4, in all kinds of steels, the piston rings of the present invention exhibit the small number of lapping until the contact with the whole periphery is obtained compared to the conventional piston ring and hence, it is understood that the advantageous effect of the present invention is remarkable. Further, although it is estimated that a proper value exists with respect to the difference in film thickness between the butt ends and the other portion based on the heat resistance of steels, it is apparent that the rotational speed ratio can be determined by repeating the number of experiments.

Then, the fatigue test is performed on the manufactured piston rings.

Figure 5:
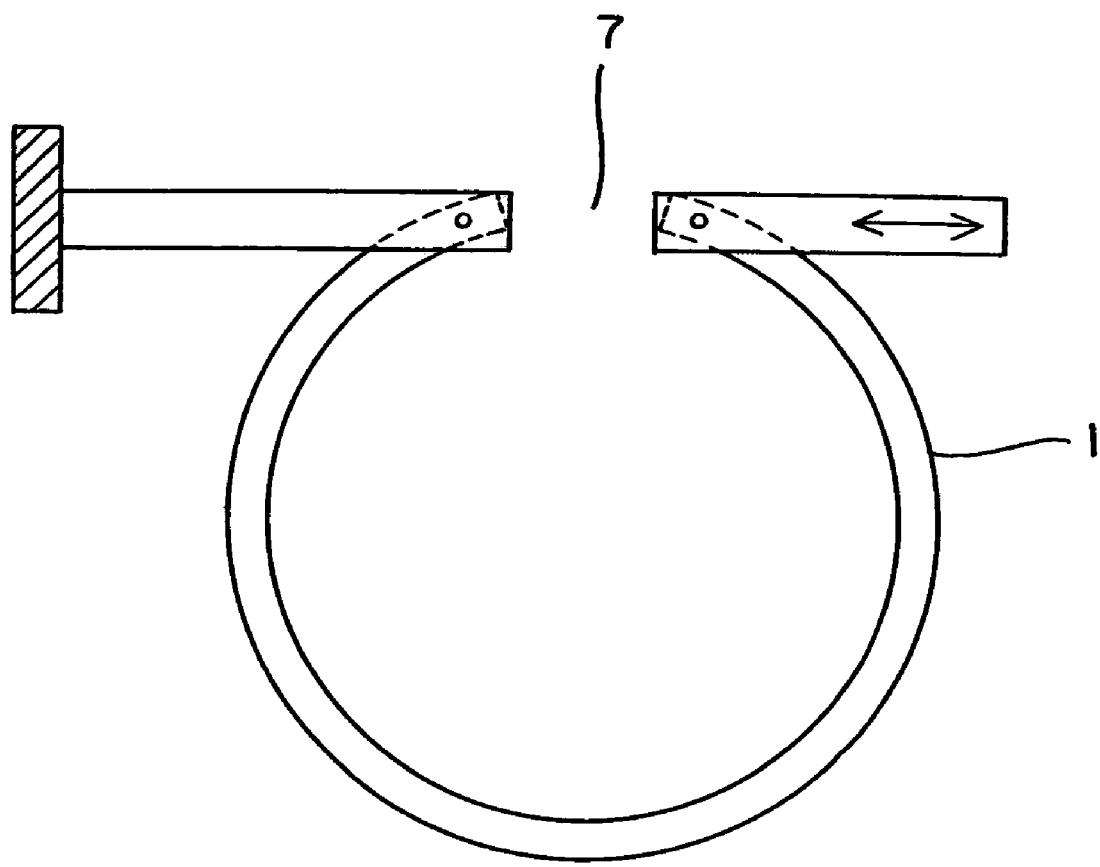
FIG. 5 is a schematic showing a fatigue testing method.

As shown in FIG. 5, the fatigue tests are performed on the piston rings 1 of the embodiments 1, 4 and the comparison example using a method which repeatedly opens and closes the butt ends 7 of the piston ring 1. Results of the test are shown in FIG. 6.

Figure 6:
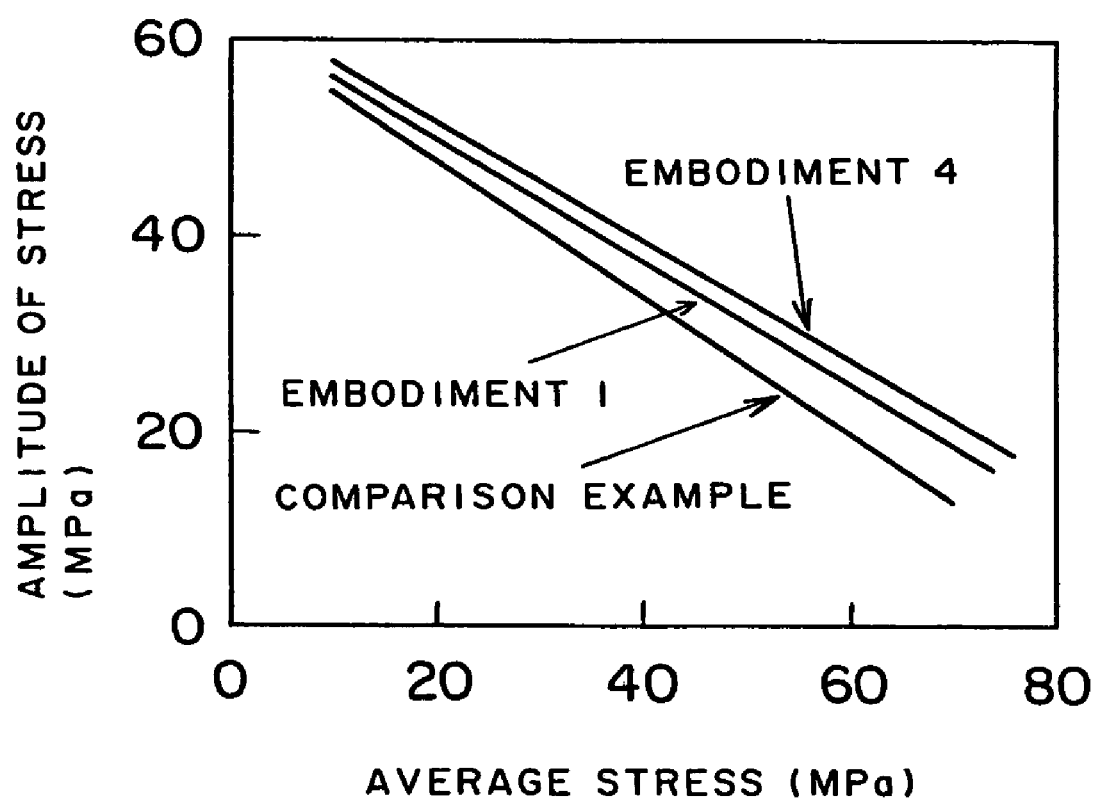
FIG. 6 is a graph showing fatigue limits of outer peripheral portions of a comparison example and the embodiments 1 and 4.

FIG. 6 shows the fatigue strength of the outer peripheral portions of the piston rings of the comparison example and the embodiments 1 and 4. From the embodiments 1 and 4, it is evident that the fatigue strength is enhanced in both embodiments compared to the comparison example. The piston ring according to the present invention is effective for prevention of breakage attributed to fatigue at a position opposite to the butt ends.

Further, the piston ring 1 of the comparison example using the steel wire A and the piston rings 1 of the embodiments 1, 3, 4 are set to respective cylinders of a 4-cylinder diesel engine and the durability evaluation is performed at a rated output for 600 hours. Results of the evaluation are shown in Table 5.

TABLE 5

| | Film thickness of butt ends after durability test | Film thickness of portion opposite to butt ends after durability test | Expected worn-out time of outer peripheral film | Worn-out portion (expected) |
|---|---|---|---|---|
| Comparison example | 12 μm | 25 μm | 1000 Hr | butt ends |
| Embodiments | | | | |
| 1 | 23 μm | 17 μm | 1370 Hr | butt ends |
| 3 | 35 μm | 9 μm | 1500 Hr | Portion opposite to butt ends |
| 4 | 24 μm | 15 μm | 1320 Hr | butt ends |

As can be understood from this table, in the piston rings of the present invention, the ion plating film thickness of the butt ends after durability test is greater than the corresponding ion plating film thickness of other portion and hence, it is appreciated that the time until the film is worn out is prolonged compared to the conventional piston ring. That is, it is understood that the durability of the piston ring is enhanced.

As described above, it is understood from FIG. 6 and Table 5 that compared to the conventional piston ring, the piston ring of the present invention exhibits excellent durability and has no risk of breakage thereof.

The advantageous effects of the piston ring of the present invention are as follows:

The hard ion plating film having high wear resistance which is coated to the outer periphery of the piston ring holds the compressive residual stress and hence, there is no risk that the film is peeled off due to fatigue even when the piston ring receives the friction force which is repeatedly loaded due to the sliding movement relative to the inner wall of the cylinder.

Further, the film having a large film thickness is formed on the outer peripheral surface in the vicinity of the butt ends where the sliding condition is severe so that the film is liable to be worn out. Accordingly, it is possible to eliminate conventional problems such as lowering of the sealing performance and scuffing which is generated by the rapid wear progress due to the exposure of the substrate material portion after the dissipation of the hard film. Since the hard film having a small film thickness is formed at portions other than the butt ends, even when the film is made to hold the compressive residual stress therein, the chipping of the hard film or the like hardly occurs so that the yield rate of the manufacturing process can be enhanced. Further, since the film is thin, the tensile residual stress which is generated in the substrate material portion right below the film also becomes small so that the fatigue rapture of the piston ring hardly occurs.

Compared to a case in which the thick film is uniformly formed on the outer periphery surface, the film is made thick only at portions which are liable to be worn out and hence, the film forming time can be shortened whereby the productivity using the expensive film forming equipment can be enhanced and the target consumption is also small. Accordingly, the piston ring can be manufactured at a low cost.

Further, from a viewpoint of manufacturing, when the stacked piston ring blanks are mounted on a number of jigs and they are rotated around their own axes and revolved around the evaporation source which is positioned at the revolving center so as to coat ion plating films to outer peripheral surfaces of the piston rings, they are set on respective positions in the ion plating equipment such that the rotation of the butt ends of them is in phase, and the rotation/revolution speeds in the period that the butt ends straightly face the evaporation source are set lower than those in the period that the other portions straightly face the evaporation source. By means of such a simple control, it is possible to easily form the hard film having the arbitrary film thickness distribution to the outer peripheral surfaces of the stacked piston ring blanks.

Further, the method of the present invention exhibits the excellent mass productivity in one batch processing and, at the same time, the properties dispersion of the piston rings are also small and hence, it is possible to ensure the high stability in quality. The piston ring with the ion plating film coated by the above-mentioned process exhibits the small change of curvature at the outer peripheral portion of the butt ends, and hence, the lapping time can be shortened and the wear of the lapping sleeve can be reduced.

Although the film thickness is inspected only at two points of the butt ends and the portion opposite to the butt ends in these embodiments, in view of the fact of the rotational speed control like sinusoidal waves and the state of contact surfaces at the time of performing lapping, it is evident that the film thickness is changed substantially continuously.

Further, although the state of the contact surface at the time of lapping is slightly worse with respect to the piston ring which is manufactured by making the rotational speed of the butt ends slow only in the vicinity of evaporation source compared to the case of the sinusoidal waves control, the level does not cause any serious problem from a manufacturing viewpoint.

In these embodiments, the piston rings are formed one by one in an elliptical shape using an NC controlled coiling machine. However, it is also possible to obtain piston rings having the butt ends whose film thickness is greater than that of other portions by steps as follows:

cutting the steel wire after continuously forming it in a perfect circle;

widening a gap between the butt ends;

heating the blanks under the above-mentioned strain relieving heat treatment conditions and holding such heat treatment temperature so as to form an approximate shape; and, thereafter, forming the outer peripheral surface into a given shape; and performing post steps similar to those of these embodiments.

The invention claimed is:

1. A piston ring using a piston ring blank having a fixed ring thickness which is formed by coiling a steel wire material and having an outer peripheral surface thereof coated with a hard film by ion plating, wherein a film thickness of the hard film in the vicinity of butt ends is greater than a film thickness of other outer peripheral surface wherein the hard film is a film which is mainly composed of nitride and holds a compressive residual stress therein.

2. A piston ring according to claim 1, wherein the film thickness in the vicinity of the butt ends is 1.5 to 4 times as thick as the film thickness at a portion opposite to the butt ends.

3. A piston ring according to claim 1, wherein the film thickness of the outer peripheral surface of the butt ends of the piston ring is 40 to 55 μm.

* * * * *